United States Patent [19]

Verheijen et al.

[11] Patent Number: 5,068,918
[45] Date of Patent: Nov. 26, 1991

[54] RECEIVER FOR TERRESTRIAL AM AND SATELLITE FM-TV BROADCASTING SIGNALS

[75] Inventors: Paulus A. M. Verheijen; Ronald P. A. Schiltmans, both of Eindhoven, Netherlands

[73] Assignee: U.S. Philips Corporation, New York, N.Y.

[21] Appl. No.: 530,687

[22] Filed: May 30, 1990

[30] Foreign Application Priority Data

Jun. 8, 1989 [NL] Netherlands .......................... 8901460

[51] Int. Cl.$^5$ .............................................. H04B 1/16
[52] U.S. Cl. .................................... 455/142; 455/143; 455/188; 455/191; 455/196; 358/191.1
[58] Field of Search ............................ 455/142–144, 455/176, 180, 188, 190, 191, 196, 214, 257; 358/191.1, 192.1, 189

[56] References Cited

U.S. PATENT DOCUMENTS

| | | | |
|---|---|---|---|
| 4,070,628 | 1/1978 | Funabashi | 325/316 |
| 4,380,823 | 4/1983 | Higashiyama et al. | 455/143 |
| 4,467,360 | 8/1984 | Fosse | 358/197 |
| 4,688,264 | 8/1987 | Miura | 455/168 |
| 4,731,877 | 3/1988 | Moon | 455/340 |
| 4,939,789 | 7/1990 | Sakashita et al. | 455/260 |

FOREIGN PATENT DOCUMENTS 0287223  11/1988  Japan .......................... 455/142

Primary Examiner—Reinhard J. Eisenzopf
Assistant Examiner—Chi H. Pham
Attorney, Agent, or Firm—Edward W. Goodman

[57] ABSTRACT

A receiver for terrestrial AM-HF-TV signals and satellite FM-HF-TV signals in first and second frequency ranges, respectively, of mutually predominantly equal widths, which succeed each other in frequency, includes, arranged one after the other, a HF-AM-FM section, a mixing circuit common for the AM and FM-TV signals and an IF device, oscillator mixing signals being applied from a tuning oscillator to that mixing circuit for a frequency conversion of the AM and FM-HF-TV signals into a first AM and an FM intermediate frequency signal, respectively, having a first AM and an FM intermediate frequency, of which at least the first AM intermediate frequency is located above the first frequency region. In order to enable a simple and cheap realization, in which a tuning oscillator having a comparatively narrow-band tuning range can be used, the first AM intermediate frequency is of the order of magnitude of twice the highest frequency of the first frequency range and the FM intermediate frequency is of the order of magnitude of one-half the lowest frequency of the second frequency range, the IF-device including an AM and a FM-IF section whose inputs are coupled to an output of the mixing circuit for a separate selection and processing of the first AM and the FM-intermediate frequency signals, respectively.

4 Claims, 1 Drawing Sheet

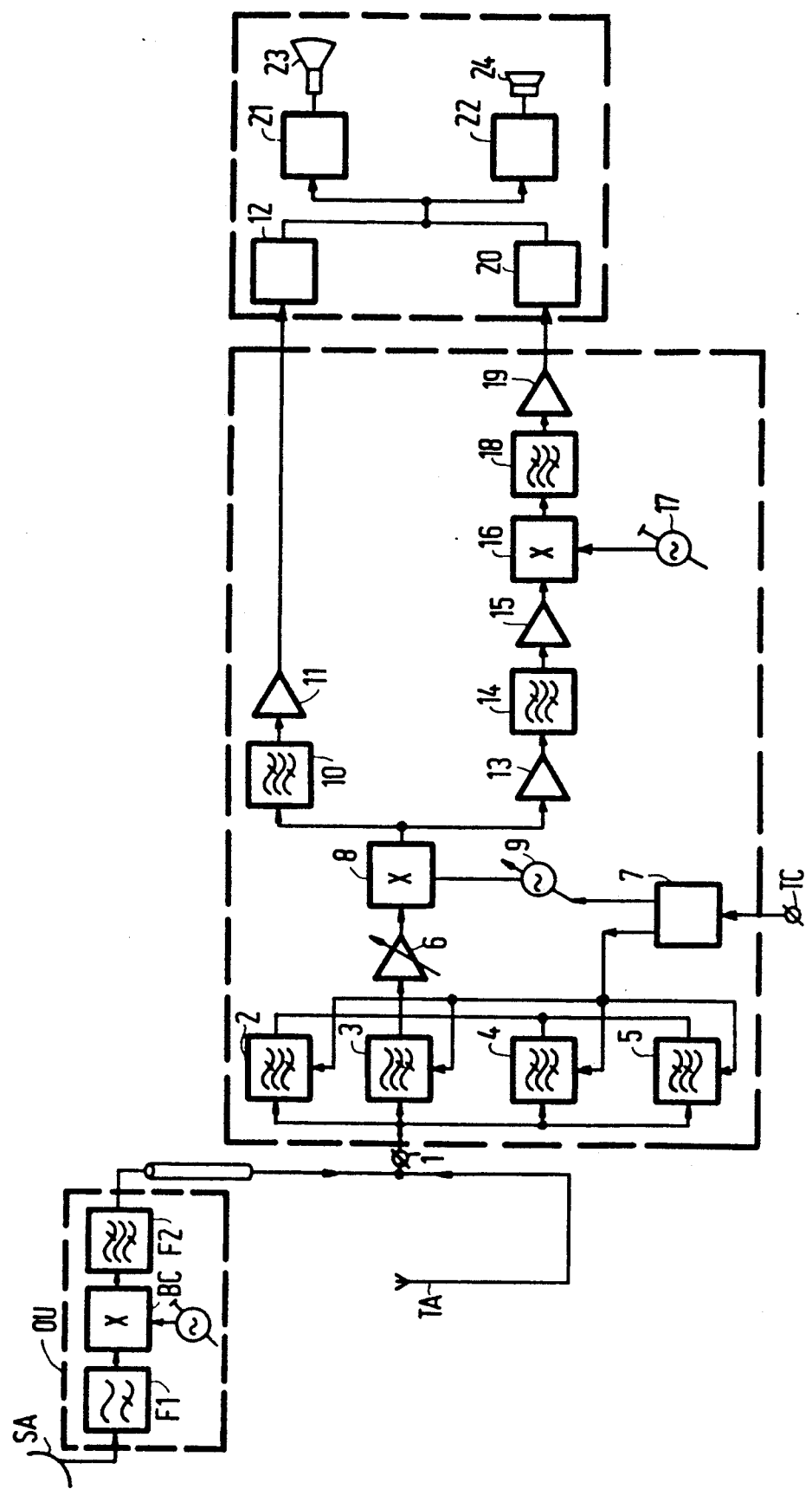

RECEIVER FOR TERRESTRIAL AM AND SATELLITE FM-TV BROADCASTING SIGNALS

BACKGROUND OF THE INVENTION

1. Field of the Invention

The invention relates to a receiver for terrestrial AM and satellite FM-HF-TV signals in first and second frequency ranges, respectively, of mutually substantially equal dimensions, which succeed each other in frequency, comprising, arranged one after the other, a HFAM/FM section, a mixing circuit common for the AM and FM-TV signals and an IF device, oscillator mixing signals being applied by a tuning oscillator to the mixing circuit for a frequency conversion of the AM and FM-TV signals into a first AM and an FM intermediate frequency signal, having a first AM and an FM intermediate frequency, respectively, of which at least the first AM intermediate frequency is located above the first frequency range.

2. Description of the Related Art

Such a TV receiver is disclosed in, for example, the European Patent Application no. 276,141.

Terrestrial AM-HF-TV broadcasing signals—abbreviated to AM-HF-TV signals hereinafter—are applied to the known TV receiver in a first frequency range of approximately 10 MHz to 850 MHz and satellite FM-HF-TV broadcasting signals—abbreviated to FM-HF-TV signals hereinafter—in a second frequency range of approximately 950 MHz to 1800 MHz. The AM and FM-HF-TV signals are applied to the said mixing circuit after a broadband HF selection and amplification in the HF AM/FM section. The frequency of the tuning oscillator is adjusted such that the mixing circuit converts the AM and the FM HF-TV signals to the same intermediate frequency. This intermediate frequency is chosen to have a value above the first frequency range. Swing compression is used during tuning to a FM-HF-TV signals to make a common usage of the FM section possible for both the AM and the FM intermediate frequency. The tuning range of the tuning oscillator must be relatively large and the known TV receiver is provided with a number of frequency phase control loops, to realize an adequate frequency conversion and frequency swing compression in the mixing circuit. Delay time phenomena may cause unwanted frequency-dependent interferences. Furthermore, the intermediate frequency chosen deviates from the now already customary value, at least as far as the FM-TV signal is concerned. This causes the cost of producing the known TV receiver to be high.

SUMMARY OF THE INVENTION

The invention has for its object to provide a receiver for terrestrial AM and satellite FM-HF-signals which obviates the above drawbacks.

According to the invention, a receiver of the type defined in the opening paragraph, is characterized in that the first AM intermediate frequency is of the order of magnitude of twice the highest frequency of the first frequency range and the FM intermediate frequency is of the order of one half the lowest frequency of the second frequency range, the IF device comprising an AM section an and VFM-IF section, inputs of which are coupled to an output of the mixing circuit for a separate selection and processing of the first AM intermediate frequency signal and the FM intermediate frequency signal, respectively.

The Japanese Kokai 87-128690 describes a TV receiver, in which a mixing circuit is used which converts the AM and FM-HF signals into a FM and AM intermediate frequency which may be mutually divergent.

The invention is based on the recognition that a down conversion of the TV-HF broadcasting signals in the second frequency range, located higher, and an up conversion of the TV-HF broadcasting signals in the first frequency range, located lower, by means of the same mixing circuit results in the frequency control range of the tuning oscillator, necessary for tuning to a TV signal in the first frequency band—denoted FM frequency control range hereinafter—being at least partly identical to the control range necessary for tuning to a TV signal in the second frequency band—denoted AM frequency control range hereinafter.

When the measure according to the invention is applied, the FM control range largely corresponds to the AM frequency control range and the total control range amounts to less than one octave. As a result thereof, the tuning oscillator may be of a simple structure and is therefore relatively cheap. The circuit is less sensitive to interferences than the prior art receiver, because FM swing compression need not be applied because of the separate processing of the AM and FM intermediate frequency signals, so that the loops required therefor may be omitted.

The value of the FM intermediate frequency of the TV receiver according to the invention allows of using its existing circuit for processing the FM-IF signal up to and inclusive of the display thereof.

A cheap realization of the receiver according to the invention as one integral whole is therefore possible.

A further price reduction is possible in a preferred embodiment of such a receiver, wherein the AM-IF section is provided with an AM-IF filter, coupled to an output of the mixing circuit which is characterized by a further mixing circuit, which is coupled to an output of the AM-FM filter, to which oscillator mixing signals are applied by a fixed oscillator for a further frequency conversion of the first AM-IF intermediate frequency signal into a second AM-IF intermediate frequency signal, having a second AM intermediate frequency, the dimension of which is of the order of the lowest frequency of the first frequency range.

Applying this measure renders it possible to use existing circuits in a simple manner for processing the second AM intermediate frequency signal up to and inclusive of display, which circuits are found in normal terrestrial TV superheterodyne receivers.

A further preferred embodiment of this receiver is characterized, in that the FM, the first and the second AM intermediate frequencies are of the order of 500 MHz, 1800 MHz and 40 MHz, respectively.

BRIEF DESCRIPTION OF THE DRAWING

The invention will now be described in greater detail by way of example with reference to the sole Figure of the accompanying drawing.

DESCRIPTION OF THE PREFERRED EMBODIMENT

This Figure shows a receiver according to the invention for terrestrial AM and satellite FM-HF-TV signals—denoted AM and FM-HFTV signals hereinafter—in first and second frequency ranges of approximately 40-900 MHz, and 900-1800 MHz respectively. The receiver shown has a HF-input 1, to which the AM-HF-TV signals are applied directly from a terrestrial aerial arrangement TA and the FM-HF-TV signals from a satellite aerial arrangement SA via an outdoor unit OU. For the sake of completeness, it should be noted that the outdoor unit OU is provided, coupled one after the other to SA, with: a first microwave filter F1 for a high-pass selection of the received satellite FM-HF-TV signals, located in a frequency band of 12 GHz, a block converter BC comprising a mixing circuit to which oscillator mixing signals having a fixed frequency are applied from a fixed oscillator for a block conversion of these last-mentioned FM-HF-TV signals to the second frequency range, and a second microwave filter F2 for a band-pass section of the FM-HF-TV signals in the second frequency range.

The receiver shown is provided with a HF-AM/FM section 2-6, which is used in common for both the AM and the FM-HF-TV signals. This section comprises a parallel arrangement of four switchable HF input filters 2 to 5, coupled to the HF input 1, each having a passband of not more than one octave. The passbands of these HF input filters succeed each other in frequency, those of the HF input filters 2-4 together covering the first frequency range of 40-900 MHz and the HF input filter 5 covering the second frequency range of 900-1800 MHz. The HF input filters 2 to 5 are switchable from a tuning control circuit 7, still to be described hereinafter, in such a manner that not more than one of the HF input filters 2-5 is operative for selection. Higher order interferences as a result of non-linearities in the subsequent circuit are limited to a minimum, since each of the HF input filters has a passband of not more than one octave.

The HF-AM/FM section 2-6 also includes a gain-controlled amplifier 6 for controlling the amplitude of the AM or FM-HF-TV signal, selected by one of the HF/input filters 2-5 to a fixed level. To that end, a gain control signal is generated in a manner known per se, for example by derivation from the baseband video signal (not shown), and is applied to a control input of the amplifier 6 (not shown).

The AM or FM-HF-TV signal thus selected and whose level is stabilized is subsequently applied to a mixing circuit 8 which is used in common for both AM and FM signals, which is coupled to an output of the amplifier 6 and to which tunable oscillator mixing signals are applied from a local tuning oscillator 9. The frequency of a desired AM-HG-TV signal in the first frequency range is converted in the mixing circuit 8 into a first AM-intermediate frequency (AM-IF) of the order of 1800 MHz, i.e. of the order of twice the highest frequency of the first frequency range, by an appropriate tuning of the oscillator frequency in a frequency range of approximately 1900 MHz to 2700 MHz. The AM-IF-TV signal at the said first AM intermediate frequency thus obtained is designated, for the sake of brevity, the first AM-IF-TV signal in the sequel of this description. A desired FM-HF-TV signal in the second frequency range is converted into a FM intermediate frequency (FM-IF), of the order of 480 MHz, i.e. of the order of one half the lowest frequency (900 MHz) of the second frequency range, by an appropriate tuning of the oscillator frequency in a frequency range of approximately 1420-2300 MHz. The overall tuning range of the tuning oscillator 9 necessary to enable tuning to a frequency in both the first and second frequency ranges, is located between approximately 1400 MHz and 2700 MHz and consequently amounts to less than one octave. The tuning oscillator 9 may consequently be of a simple structure.

Tuning of the tuning oscillator 9 is obtained by deriving, via the tuning control circuit 7, a tuning control signal from a tuning datum applied to a control input TC of the circuit 7. A switching signal is also derived from this tuning datum, this signal switching that filter of the HF-input filters 2-5 to a state active for selection whose passband contains the desired HF-TV signal. The tuning control circuit 7 is compled to circuit inputs of the HF-input filters 2 to 5 for this purpose.

The FM and AM-IF-TV signals are separatelY processed in a FM-IF section 10, 11 and an AM-IF section 13-19, respectively, after frequency conversion in the mixing circuit 8. The FM-IF section 10, 11 includes a FM-IF filter 10 and a FM-IF amplifier 11 for an IF selection and amplification of the FM-IF signal. The FM-IF amplifier 11 is coupled to a FM-demodulator circuit 12 for demodulating the FM-IF-TV signal to the baseband.

The AM-IF section 13-19 includes a first AM-IF amplifier 13, followed by a first AM-IF filter 14 and a second AM-IF amplifier 15, in which an IF selection and an amplification of the last-mentioned AM-IF signal, respectively, occur. The second AM-IF amplifier 15 is coupled to a mixer stage 16, to which oscillator mixing signals having a fixed frequency are applied from a fixed oscillator 17. The frequency of the fixed oscillator is chosen such that the first AM-IF-TV signal of the first AM-intermediate frequency (1800 MHz) is converted to a lower second AM intermediate frequency which results in a second AM-IF signal. The second AM intermediate frequency is preferably chosen to have a value of 38.9 MHz, which is a normal value for TV receivers, so that existing circuits may be used for the subsequent AM signal processing operation.

The mixer stage 16 is connected to a second AM-IF filter 18, which is followed by a third AM-IF amplifier 19 for an AM-IF selection and amplification of the second AM-IF-TV signal. The third AM-IF amplifier 19 is coupled to an AM-demodulation circuit 20 for demodulating the second AM-IF-TV signal to the baseband. The AM-demodulation circuit 20 and the FM-demodulation circuit 12, mentioned in the foregoing, are both mutually coupled to inputs of a video and an audio signal processing section 21 and 22 for application to a picture display and sound reproducing device 23 and 24, respectively, for a processing of the video and audio signal components in the baseband TV signals applied thereto by one of the demodulation circuits 12 and 20.

It will be obvious that the use of the inventive idea is not limited to the embodiment shown. Thus, it is equally possible to use, for example, more or less parallel filters having a smaller or a larger passband, respectively, instead of the parallel arrangement of HF input filters 2-5 each having a passband of one octave, to apply both the AM and FM-IF-TV signals via mutually separate inputs to the HF input filters 2-3 and the HF input filter 5 respectively, instead of via a common HF signal input and to apply a single superheterodyne AM signal processing operation, whereby the first AM-IF signal is demodulated directly, instead of the double heterodyne signal processing of the AM-TV signal shown.

We claim:

1. A receiver for terrestrial AM-HF-TV signals and satellite FM-HF-TV signals in a first frequency range and a second frequency range, respectively, which succeed each other in frequency, said first and second frequency ranges having substantially the same frequency width, said receiver comprising a HF-AM/FM section having an input for receiving said AM-HF-TV signals and said FM-HF-TV signals and an output for providing selected portions thereof; a mixing circuit common for the AM-HF-TV and FM-HF-TV signals coupled to the output of said HF-AM/FM section; and an IF device coupled to an output of said mixing circuit, said receiver further comprising a tunning oscillator for applying oscillator mixing signals to the mixing circuit for a frequency conversion of the AM-HF-TV signals into a first AM intermediate frequency signal and a frequency conversion of the FM-HF-TV signals into an FM intermediate frequency signal, said first AM intermediate frequency signal and said FM intermediate frequency signal having, respectively, a first AM intermediate frequency and an FM intermediate frequency, of which at least the first AM intermediate frequency is located above the first frequency range; characterized in that said IF device comprises an AM-IF section and an FM-IF section, inputs of which are coupled to an output of the mixing circuit for a separate selection and processing of the first AM and the FM intermediate frequency signals, respectively, and wherein the first AM intermediate frequency is of the order of magnitude of twice the highest frequency of the first frequency range band and the FM intermediate frequency is of the order of magnitude of one-half the lowest frequency of the second frequency range, whereby the tuning oscillator has a tuning range of less than one octave.

2. A receiver as claimed in claim 1, characterized in that said AM-IF section comprises an AM-IF filter coupled to the output of said mixing circuit, a further mixing circuit coupled to an output of the AM-IF filter, and a fixed oscillator for applying oscillator mixing signals to said further mixing circuit, said further mixing circuit providing a further frequency conversion of the first AM intermediate frequency signal into a second AM intermediate frequency signal having a second AM intermediate frequency of the order of magnitude of the lowest frequency of the first frequency range.

3. A receiver as claimed in claim 2, characterized in that said first frequency range includes signals predominantly located between 40 MHZ and 850 MGZ, and said second frequency range includes signals predominantly located between 950 MHZ and 1800 MHZ, wherein said FM intermediate frequency and said first and second AM intermediate frequencies have respective orders of magnitude of 500 MHz, 1800 MHz and 40 MHz.

4. A receiver as claimed in claim 1, 2 or 3, characterized in that said HF-AM/FM section comprises a parallel arrangement of n switchables bandpass filters having inputs respectively coupled to the input of said HF-AM/FM section and outputs respectively coupled to the output of said HF-AM/FM section, and n switchable bandpass filters having n consecutive bandpass frequency ranges, respectively, each being not greater than one octave, said frequency ranges collectively covering said first and second frequency ranges, and means coupled to switching inputs of said n switchable bandpass filters for alternatively switching on at least one of said n switchable bandpass filters.

* * * * *